United States Patent [19]

Dresner

[11] Patent Number: 4,697,197
[45] Date of Patent: Sep. 29, 1987

[54] TRANSISTOR HAVING A SUPERLATTICE

[75] Inventor: Joseph Dresner, Princeton Township, Mercer County, N.J.

[73] Assignee: RCA Corp., Princeton, N.J.

[21] Appl. No.: 786,888

[22] Filed: Oct. 11, 1985

[51] Int. Cl.[4] .................................... H01L 27/12
[52] U.S. Cl. .............................. 357/4; 357/23.2; 357/23.7; 357/16
[58] Field of Search ............... 357/4 SL, 4, 23.2, 23.7, 357/16

[56] References Cited

U.S. PATENT DOCUMENTS

| | | | |
|---|---|---|---|
| 4,194,935 | 3/1980 | Dingle et al. | 148/175 |
| 4,203,123 | 5/1980 | Shanks | 357/2 |
| 4,590,507 | 5/1986 | Capasso | 357/4 SL |

OTHER PUBLICATIONS

"Observation of Confined Electronic States in $Ge_x$-$Si_{1-x}$/Si Strained-Layer Superlattices", F. Cerdeira et al., Physical Review B, vol. 31, No. 2, Jan. 15, 1985, pp. 1202 to 1204.

"Amorphous Semiconductor Superlattices", B. Abeles et al., Physical Review Letters, vol. 31, No. 2, Nov. 21, 1983, pp. 2003 to 2006.

*Primary Examiner*—Martin H. Edlow
*Attorney, Agent, or Firm*—Eugene M. Whitacre; Dennis H. Irlbeck; Lester L. Hallacher

[57] ABSTRACT

A transistor has a superlattice in the channel region. The superlattice has alternate interleaved layers of undoped wide and narrow bandgap materials with the layers extending in a direction parallel to the channel region. Preferably a narrow band gap layer is adjacent a gate insulator to provide maximum increase in mobility.

18 Claims, 3 Drawing Figures

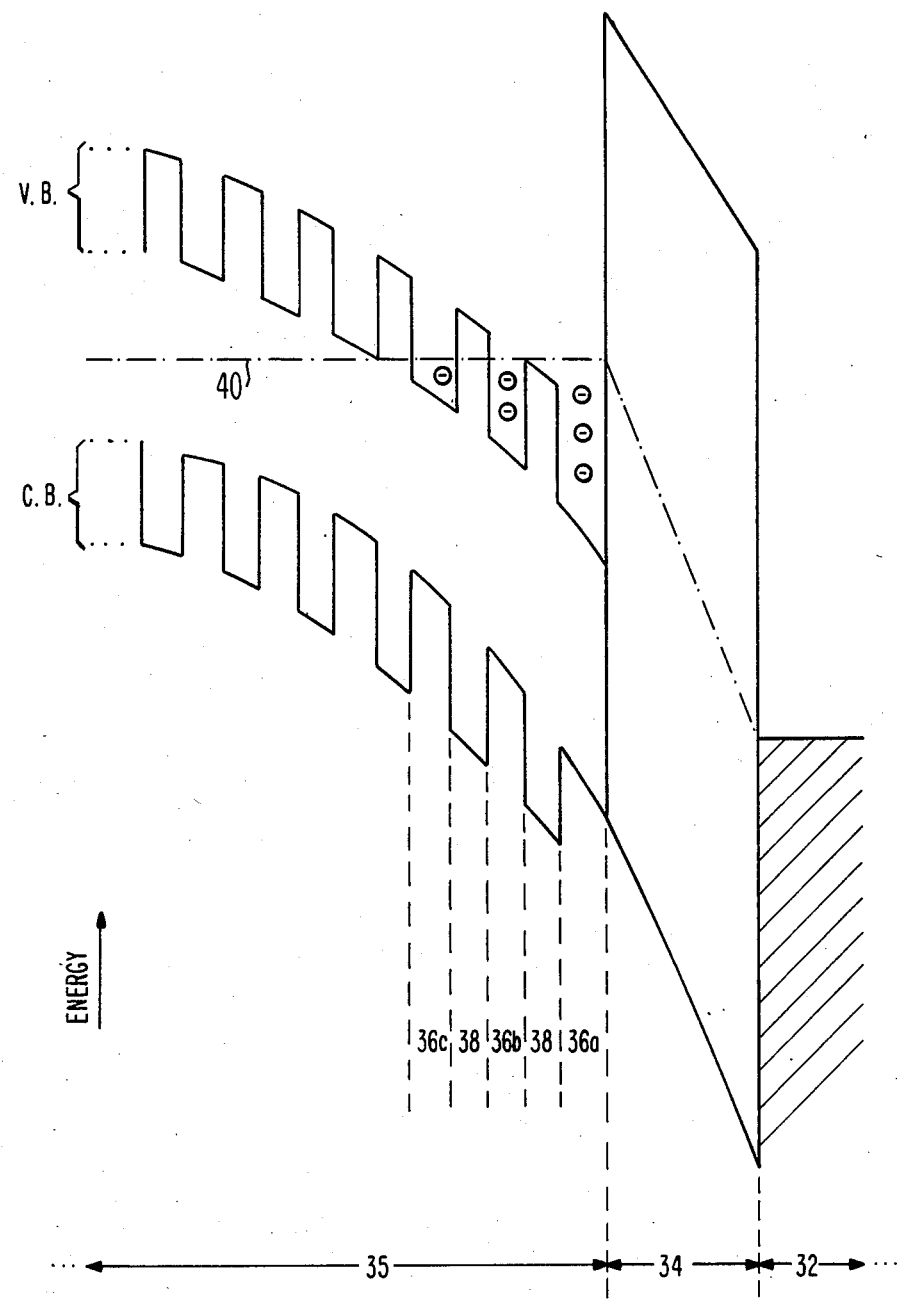

TRANSISTOR HAVING A SUPERLATTICE

BACKGROUND OF THE INVENTION

The present invention relates to a transistor that uses a superlattice in a channel region for improved mobility, and more particularly to an amorphous silicon (a-Si) thin film transistor (TFT).

In a typical a-Si TFT, the electrons have an effective (or average) drift mobility ($\mu$) that seldom exceeds 0.5 cm$^2$/volt-sec due to traps, such as structual defects or impurities, in the conduction channel. Their effective mobility can be increased by filling these traps. One way of doing this is to use a large electrical field between the gate electrode and the conduction channel, such as at least $5 \times 10^6$ V/cm. Such a large electric field increases the induced electron concentration in the channel, thus filling all the deep traps with electrons and increasing the fraction of electrons which are located in very shallow energy states and also above the mobility edge. In these latter states the mobility is the highest (about 10-20 cm$^2$/volt-sec). However, such a large field can result in breakdown of the gate insulator.

SUMMARY OF THE INVENTION

A transistor comprises spaced source and drain regions with a channel region therebetween. The channel region comprises a gate electrode and a semiconductor superlattice spaced apart by a gate insulator. The superlattice comprises undoped wide and narrow bandgap layers extending between the source and drain regions.

BRIEF DESCRIPTION OF THE DRAWING

FIG. 3 is an energy band diagram of the embodiments of FIGS. 1 and 2.

DETAILED DESCRIPTION OF THE PREFERRED EMBODIMENTS

Figure 1:
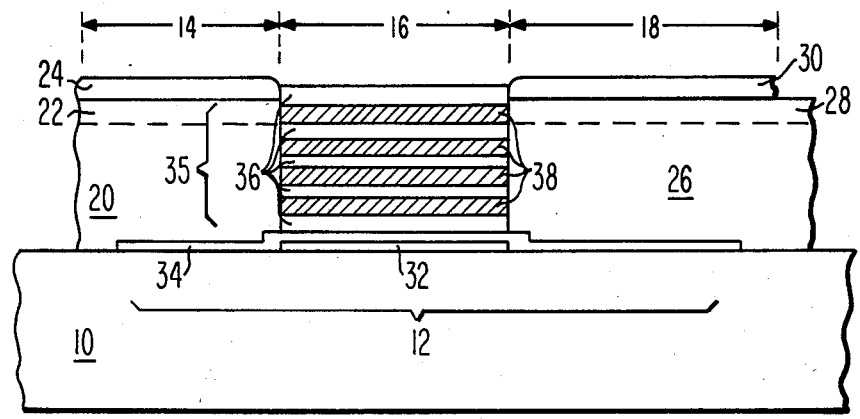
FIGS. 1 and 2 are cross-sectional views of two different embodiments of a transistor of the invention.

FIG. 1 shows a substrate 10, as glass, having thereon a TFT 12 comprising a metal oxide semiconductor field effect transistor (MOSFET) constructed as a "staggered inverted structure". The TFT 12 has a source region 14, a channel region 16, and a drain region 18. The source region 16 typically comprises an undoped hydrogenated amorphous silicon (a-Si:H) layer 20 with an N-conductivity type portion 22 at the top thereof for ensuring good ohmic contact to a source electrode 24. Similarly, the drain region 18 comprises an undoped a-Si:H layer 26, an N-conductivity type portion 28, and a drain electrode 30.

The channel region 16 comprises a gate electrode 32 disposed on the substrate 10, a gate insulator 34 disposed on the gate electrode 32, and a superlattice 35 disposed on the gate insulator 34. The superlattice 35 comprises alternate layers of a narrow bandgap material 36 (shown without cross-hatching), and a wide band gap material 38 (shown with cross-hatching). The layers 36 and 38 extend in a direction parallel to the channel region 16, i.e. parallel to a line between the source and drain regions, 14 and 18, respectively.

The electrodes 24, 30, and 32 are formed of a good conducting material, such as chromium, that can be deposited by evaporation or sputtering. The remaining elements of the TFT 12 are typically deposited from a glow discharge in silane and doping gas, as disclosed, for example, by Carlson in U.S. Pat. No. 4,064,521, or silane, doping, and alloying gases as disclosed by Pankove in U.S. Pat. No. 4,109,271, both patents incorporated herein by reference. The gate insulator 34 can comprise a material such as a silicon oxide, silicon nitride, aluminum oxide, or combinations thereof. The gate insulator 34 can be formed by chemical vapor deposition (CVD) or plasma enhanced CVD. The narrow bandgap layers 36 have a thickness between about 3 and 15 nanometers (nm), preferably not greater than about 6 nm, and can comprise undoped a-Si, a-Si:H, or a-SiGe:H. The wide bandgap layers 38 have a typical thickness of about 10 nm and can comprise a-Si:H alloyed with either carbon or nitrogen. Typically there are 5 to 30 pairs of layers for a superlattice 35 having a total thickness between about 50 and 250 nm.

The gate electrode 32 is deposited on the substrate 10 followed by the gate insulator 34 being deposited on the gate electrode 32. Then the layers 36 and 38 are deposited and patterned. The source and drain layers 20 and 26 are then deposited with a doping gas used near the end of said deposition to form the doped portions 22 and 28. Thereafter excess a-Si is removed from over the superlattice 35 and the electrodes 24 and 30 are deposited.

Figure 2:
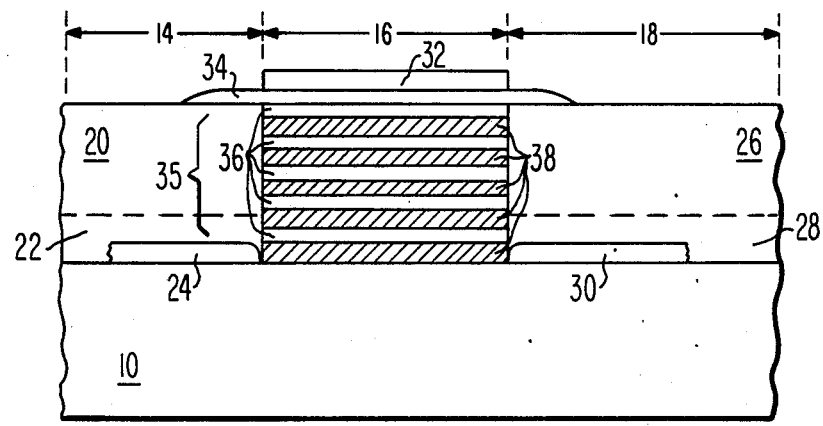

FIG. 2 shows a second embodiment wherein corresponding reference numbers have been used on corresponding elements. In this embodiment the source and drain electrodes 24 and 30 are adjacent the substrate 10 and the gate electrode 32 is above the superlattice 35. The method of construction is similar to the embodiment of FIG. 1 except the first step is depositing and patterning electrodes 24 and 30 and the depositing and patterning of the gate insulator 34 and the gate electrode 32 are the last steps thereof.

In operation, the periodic structure of the superlattice 35 restricts the spatial extent of the wave function of electrons located in shallow band tail states having energy just below the mobility edge. This results in shifting all the allowed energy levels of these electrons upwards to higher energies. The energy level of electrons trapped in deeper localized defects (deep traps) will be unaffected. The shallow band tail states whose energy is shifted upwards are more numerous by several orders of magnitude than the deep traps. Thus for a given electric field a greater fraction of the total number of electrons will be located in energy states where the mobility is greater as compared with a TFT that does not include a superlattice in the channel region.

FIG. 3 shows an energy band diagram of a portion of the superlattice 35 near the gate insulator 34 when a positive gate-to-drain bias voltage is present. Under this condition, the valence bands (V.B.) and conduction bands (C.B.) of the layers 36 and 38 are reduced in energy near the gate insulator 34, thereby dropping below the Fermi level 40. Since free electrons (shown as circled minus signs) drop into the lowest available energy states, they tend to drop into the conduction bands of the narrow bandgap layers nearest the insulator 34, i.e. 36a, 36b, 36c, etc. Conduction in the TFT 12 comprises these electrons moving in a direction perpendicular to the plane of FIG. 3. Thus in order to obtain the maximum possible mobility, it is desirable to have the layer of the superlattice 35 that is nearest the insulator 34 comprise a narrow bandgap layer 36, since this provides the maximum filling of trapping states.

In operation, if no gate-source bias voltage is applied, the TFT 12 is OFF since the narrow and wide bandgap layers 36 and 38, respectively, are undoped, and therefore are poor conductors. When a positive bias voltage is applied, free electrons from the N-conductivity type portion 22 move into the undoped portion of the source region 20, through the superlattice 35, and are collected by the positively biased drain electrode 30, thereby permitting conduction in the TFT 12. Thus the TFT 12 is an enhancement mode device.

The present invention can be used as a driver transistor, and possibly as a decoder transistor, in a liquid crystal display, since the mobility will be high enough to allow conveying of video frequency signals.

By "wide bandgap" and "narrow bandgap" is meant the bandgaps relative to each other and not in any absolute sense. A minimum difference in the bandgaps of about 100 millielectron-volts is required for mobility enhancement to occur. This difference should be as large as practicable in order to maximize mobility enhancement.

It is believed that layers 36 and 38 can also be composed of a microcrystalline semiconductor material such as microcrystalline silicon.

What is claimed is:

1. A transistor comprising:
   spaced source and drain regions with a channel region therebetween;
   said channel region comprising a gate electrode, and a superlattice spaced apart by a gate insulator, said superlattice having a plurality of undoped interleaved wide and narrow bandgap layers, said layers extending between the source and drain regions.

2. The transistor of claim 1, wherein the superlattice comprises a narrow band gap layer disposed adjacent said gate insulator.

3. The transistor of claim 1, wherein said gate electrode is disposed on one side of said supperlattice, and said source and drain regions each include an electrode disposed adjacent the opposite side of said superlattice remote from said gate electrode.

4. The transistor of claim 3, wherein said source and drain regions each include electrodes disposed on a substrate.

5. The transistor of claim 3, wherein said gate electrode is disposed on a substrate.

6. The transistor of claim 1, wherein said narrow band gap layers each have a thickness between about 3 and 15 nanometers.

7. The transistor of claim 6, wherein said narrow bandgap layers have a thickness no greater than about 6 nanometers.

8. The transistor of claim 7, wherein said wide bandgap layers have a thickness of about 10 nanometers.

9. The transistor of claim 8, wherein said wide and narrow bandgap layers have a bandgap difference of at least 100 millielectron-volts therebetween.

10. The transistor of claim 1, wherein said narrow bandgap layers each comprise an amorphous material selected from the group consisting of silicon, hydrogenated silicon, and a hydrogenated silicon-germanium alloys.

11. The transistor of claim 10, wherein said wide bandgap layers each comprise an amorphous hydrogenated material selected from the group consisting of a silicon-carbon and a silicon-nitrogen alloys.

12. The transistor of claim 11, wherein said wide and narrow bandgap layers have a bandgap difference of at least 100 millielectron-volts therebetween.

13. The transistor of claim 1, wherein said wide bandgap layers have a thickness of about 10 nanometers.

14. The transistor of claim 1, wherein said wide bandgap layers comprise an amorphous hydrogenated material selected from the group consisting of a silicon-carbon and a silicon-nitrogen alloys.

15. The transistor of claim 1, wherein said superlattice has a thickness between about 50 and 250 nanometers.

16. The transistor of claim 1, wherein said superlattice comprises between about 5 and 30 pairs of narrow and wide bandgap layers.

17. The transistor of claim 1, wherein said narrow bandgap layers have a thickness no greater than about 6 nanometers.

18. The transistor of claim 1, wherein said wide and narrow bandgap layers have a bandgap difference of at least 100 millielectron-volts therebetween.

* * * * *